US008841630B2

(12) United States Patent
Henstra

(10) Patent No.: US 8,841,630 B2
(45) Date of Patent: Sep. 23, 2014

(54) CORRECTOR FOR AXIAL ABERRATIONS OF A PARTICLE-OPTICAL LENS

(75) Inventor: Alexander Henstra, Utrecht (NL)

(73) Assignee: Fei Company, Hillsboro, OR (US)

( * ) Notice: Subject to any disclaimer, the term of this patent is extended or adjusted under 35 U.S.C. 154(b) by 135 days.

(21) Appl. No.: 12/949,312

(22) Filed: Nov. 18, 2010

(65) Prior Publication Data

US 2011/0114852 A1    May 19, 2011

(30) Foreign Application Priority Data

Nov. 18, 2009 (EP) .................................. 09176323

(51) Int. Cl.
*H01J 37/153* (2006.01)
*H01J 37/26* (2006.01)

(52) U.S. Cl.
CPC .............. *H01J 37/153* (2013.01); *H01J 37/26* (2013.01); *H01J 2237/1534* (2013.01); *H01J 2237/28* (2013.01)
USPC ......................... 250/396 R; 250/310; 250/311

(58) Field of Classification Search
CPC ....................................................... H01J 37/153
USPC ..................................................... 250/396 R
See application file for complete search history.

(56) References Cited

U.S. PATENT DOCUMENTS

| | | | |
|---|---|---|---|
| 2,919,381 A | 12/1959 | Glaser | |
| 3,979,590 A | 9/1976 | Andersen | |
| 4,095,104 A | 6/1978 | LePoole et al. | |
| 4,303,864 A | 12/1981 | Crewe et al. | |
| 4,379,230 A | 4/1983 | Bouwhuis et al. | |
| 4,389,571 A | 6/1983 | Crewe | |
| 4,414,474 A * | 11/1983 | Crewe ........................ | 250/396 R |
| 4,684,808 A | 8/1987 | Plies et al. | |
| 4,853,545 A | 8/1989 | Rose | |
| 4,859,857 A | 8/1989 | Stengl et al. | |

(Continued)

FOREIGN PATENT DOCUMENTS

| | | |
|---|---|---|
| DE | 4204512 | 8/1993 |
| DE | 19633496 | 2/1998 |

(Continued)

OTHER PUBLICATIONS

Muller, Heiko, et al., 'Advancing the Hexapole Cs-Corrector for the Scanning Transmission Electron Microscope,' Microsc. Microanal, 2006, pp. 442-455, vol. 12.

(Continued)

*Primary Examiner* — Phillip A Johnston
(74) *Attorney, Agent, or Firm* — Scheinberg & Associates, PC; Michael Scheinberg

(57) ABSTRACT

Commercially available High Resolution Transmission Electron Microscopes (HR-TEM) and Scanning Transmission Electron Microscopes (HR-STEM) are nowadays equipped with correctors for correcting the axial spherical aberration $C_s$ of the so-named objective lens. Inevitably other aberrations become the limiting aberration. For the hexapole type correctors, also known as Rose correctors, or variants thereof, six-fold axial astigmatism, also known as A5, and sixth-order three lobe aberration, also known as D6, introduced by the corrector, are known to become the limiting aberration. The invention shows that by adding a weak hexapole (126) in the cross-over between the hexapoles, a Rose like corrector or a Crewe like corrector free of A5 or D6 can be made, or, by adding both the weak hexapole and a dodecapole, a corrector that is free of both A5 and D6.

16 Claims, 11 Drawing Sheets

(56) References Cited

U.S. PATENT DOCUMENTS

| | | | |
|---|---|---|---|
| 4,962,313 | A | 10/1990 | Rose |
| 5,084,622 | A * | 1/1992 | Rose ................ 250/396 R |
| 5,221,844 | A | 6/1993 | van der Mast et al. |
| 5,300,775 | A | 4/1994 | Van der Mast |
| 5,336,891 | A | 8/1994 | Crewe |
| 5,448,063 | A | 9/1995 | de Jong et al. |
| 5,798,524 | A | 8/1998 | Kundmann et al. |
| 5,838,011 | A | 11/1998 | Krijn et al. |
| 5,965,894 | A | 10/1999 | Krijn et al. |
| 5,986,269 | A | 11/1999 | Krijn et al. |
| 6,184,975 | B1 | 2/2001 | Henstra et al. |
| 6,191,423 | B1 * | 2/2001 | Krijn et al. ........... 250/396 R |
| 6,246,058 | B1 | 6/2001 | Tiemeijer |
| 6,329,659 | B1 | 12/2001 | Krijn et al. |
| 6,426,501 | B1 | 7/2002 | Nakagawa |
| 6,455,848 | B1 | 9/2002 | Krijn et al. |
| 6,489,621 | B1 | 12/2002 | Frosien |
| 6,552,340 | B1 | 4/2003 | Krivanek et al. |
| 6,605,810 | B1 | 8/2003 | Haider et al. |
| 6,723,997 | B2 | 4/2004 | Matsuya et al. |
| 6,737,647 | B2 | 5/2004 | Schonhense et al. |
| 6,770,887 | B2 | 8/2004 | Krivanek et al. |
| 6,836,373 | B2 * | 12/2004 | Hosokawa ................ 359/659 |
| 6,852,983 | B2 | 2/2005 | Matsuya et al. |
| 6,858,844 | B2 | 2/2005 | Zach |
| 6,861,651 | B2 * | 3/2005 | Rose ................ 250/396 R |
| 6,888,145 | B2 | 5/2005 | Muller et al. |
| 6,924,488 | B2 | 8/2005 | Matsuya et al. |
| 6,943,349 | B2 | 9/2005 | Adamec et al. |
| 7,012,262 | B2 | 3/2006 | Rose |
| 7,060,986 | B2 | 6/2006 | Nakamura et al. |
| 7,282,722 | B2 | 10/2007 | Sato et al. |
| 7,378,667 | B2 | 5/2008 | Henstra |
| 7,408,172 | B2 | 8/2008 | Sato et al. |
| 7,420,179 | B2 | 9/2008 | Hosokawa |
| 7,518,121 | B2 | 4/2009 | Maas et al. |
| 7,544,939 | B2 | 6/2009 | van der Zande et al. |
| 7,723,683 | B2 | 5/2010 | Sawada |
| 8,178,850 | B2 * | 5/2012 | Sawada et al. ........... 250/396 R |
| 2008/0265172 | A1 | 10/2008 | Uhlemann |
| 2008/0290264 | A1 | 11/2008 | Henstra et al. |
| 2009/0134339 | A1 | 5/2009 | Uhlemann et al. |
| 2010/0072366 | A1 | 3/2010 | Tiemeijer et al. |

FOREIGN PATENT DOCUMENTS

| | | |
|---|---|---|
| GB | 3875371 | 8/1974 |
| JP | 1264149 | 10/1989 |
| JP | 2007180013 | 7/2007 |
| WO | 9812732 | 3/1998 |
| WO | 9930343 | 6/1999 |
| WO | 0036630 | 6/2000 |
| WO | 03032351 | 4/2003 |

OTHER PUBLICATIONS

Rose, H., 'Inhomogeneous Wein Filter as a Corrector Compensating for the Chromatic and Spherical Aberration of Low-Voltage Electron Microscopes,' Optik, 1990, pp. 91-107, vol. 84, No. 3.

Haider, "Upper Limits for the Residual aberrations of a High-resolution aberration-corrected STEM", Nov. 1999, (13pp).

Koops, "Aberration Correction in Electron Microscopy", The Instrument Today and Tomorrow, (6pp).

Kaynig, "Probabilistic Image Registration and Anomaly Detection by Nonlinear Warping", (8pp).

Mitrofanov et al., "Test Sample for Scanning and Scanning Transmission Electron Microscopy on the Basis of Flerov"s Polymer Nuclear Filters", INSPEC / IEE, (1p).

Hashimoto, "Pseudo-aberration Free Focus Condition for Atomic Resolution Electron Microscope Images", abstract, (Recieved Oct. 10, 1997, accepted Jan. 9, 1998), (9pp).

The Third Transmission Electron Aberration-corrected Microscopy (TEAM) Workshop, Executive Summary, San Antonio, TX, Aug. 8, 2003.

Sawada, Hidetaka, et al., 'Correction of Higher Order Geometrical Aberration by Triple 3-Fold Astigmatism Field,' Journal of Electron Microscopy, Jul. 8, 2009, pp. 341-347, vol. 58, Iss. 6.

Scherzer, Von O., "Über einige Fehler von Elektronenlinsen", Z. Physik, Jun. 4, 1936, p. 593, vol. 101.

"Third TEAM Workshop" Aug. 8, 2003, 43 pgs.

"Canemco: Scanning Electron Microscopy Supplies," 33 pgs.

\* cited by examiner

CORRECTOR FOR AXIAL ABERRATIONS OF A PARTICLE-OPTICAL LENS

The invention relates to a corrector for correcting axial aberrations of a particle-optical lens, the corrector to be irradiated with a beam of charged particles, the corrector comprising:
   a first multipole for generating a first hexapole field,
   a second multipole for generating a second hexapole field,
   an optical system for imaging the first multipole on the second multipole and for forming a cross-over of the beam between the multipoles; and
   the magnification of the optical system being negative.

The invention further relates to an apparatus equipped with such a corrector, and to the use of such an apparatus.

Such a corrector is known from U.S. Pat. No. 5,084,622, describing the so-named Rose corrector.

A particle-optical apparatus, such as electron microscopes or electron lithography apparatus, is arranged to irradiate an object to be imaged or treated by means of a beam of electrically charged particles (usually an electron beam or an ion beam), which is produced by means of a particle source such as a thermal electron source, an electron source of the field emission type, a Liquid Metal Ion Source, a plasma ion source or the like. The aim of the irradiation of the object may be, but is not limited to, to image the object (inspection of specimens in an electron microscope), to form very small structures on the object (micromachining and beam induced deposition with e.g. a focused ion beam), or to extract small samples from a larger substrate using by excavation of the sample and attaching it to a manipulator using a focused ion beam. In all these cases focusing lenses are required to manipulate (focus) the electron beam.

Typically an object can be irradiated in two ways.

According to the first method, an object, also named the specimen, to be examined is irradiated by a parallel beam with more or less uniform current density an enlarged image of the specimen is formed by means of the lenses. The focusing lens closest to the specimen, the so-named objective lens contributes most to the errors introduced by the optics magnifying the specimen. In other words: the aberrations of the objective lens determine the resolution of the apparatus.

An apparatus where the specimen is irradiated with a more or less uniform, parallel beam is, for example, a Transmission Electron Microscopes (TEM).

According to a second method, the emissive surface of the particle source, or a part thereof, is imaged, usually at a strongly reduced scale, on the specimen to be examined. This image, the so-named spot or probe, is scanned over the surface of the specimen by means of, for example, scanning coils or electrostatic deflector plates, in response of which e.g. radiation is emitted or reflected by the specimen. The radiation may comprise X-rays, secondary electrons, backscattered electrons, etc. The image of the source is formed by means of an imaging lens system. The focusing lens closest to the specimen is named the objective lens. The lens errors of this objective lens determine the smallest spot size that can be obtained and hence the resolution of the apparatus.

This method of imaging is used in, for example, a Scanning Electron Microscope (SEM) and a Scanning Transmission Electron Microscope (STEM), where an incident probe of electrons is used to generate secondary electrons, diffracted electrons, backscattered electrons, X-rays, and the like.

It is noted that in a Focused Ion Beam apparatus (FIB) a finely focused beam of ions is formed to impinge on the object. Similar to a SEM this spot is scanned over the object, where is may be used to machine the object (milling and/or etching) or to image the object (by detecting e.g. secondary ions and/or electrons).

As ions are much heavier than electrons, they are less susceptible to magnetic fields and typically electrostatic lenses (and deflectors) are used, while for instruments using beams of electrons typically magnetic lenses and deflectors are used.

It is also noted that TEM's are often capable to work as a STEM as well. Such an apparatus, capable of both focusing/imaging methods, is often referred to as a TEM, a STEM, or as a S/TEM.

The lenses used in the earlier mentioned apparatus are typically magnetic or electrostatic lenses showing axial symmetry, so-named round lenses. As known to the skilled person such a lens is, assuming that the energy of the particles is not changed, always a positive lens.

As shown by Scherzer in 1936 (O. Scherzer, "Über einige Fehler von Elektronenlinsen", Z. Physik 101 (1936), p. 593), such lenses always show a positive spherical aberration coefficient. Therefore the aberrations of one round lens can never be corrected by the aberrations of another round lens.

Scherzer already mentioned in 1947 (O. Scherzer, "Sphärische and chromatische Korrektur von Elektronenlinsen", Optik 2 (1947), p. 114), that such aberrations can be corrected with multipoles. A multipole is an optical element for generating a field showing N-fold rotational symmetric, with N an even integer. Examples of multipoles are thus dipoles, quadrupoles, hexapoles, etc.

In order to enhance the resolution of the particle-optical apparatus, it is known from the cited U.S. Pat. No. 5,084,622 to reduce said lens defects by means of a so-named Rose corrector using (magnetic) hexapole fields. This correction unit is formed by two hexapoles between which there is arranged an optical system for imaging one hexapole onto the other. The optical system is formed by a so-named f/2f/f doublet (see FIG. 1). Another lens system, also a doublet, the so-named transfer lens doublet, images the hexapoles on the coma-free plane of the objective lens.

It is noted that variations of the Rose corrector are known in which the doublet of the optical system is not a f/2f/f system (which by definition shows a magnification M=−1), but shows a different magnification. Also a different magnification of the transfer lens doublet is used and variants where the transfer optics contain only one lens.

It is further noted that U.S. Pat. No. 4,389,571 also describes a two-hexapole corrector, the so-named Crewe corrector, in which the optical system between the hexapoles consists of only one lens imaging the hexapoles upon each other.

It is well known to the person skilled in the art that a dual hexapole system shows residual intrinsic aberrations, as for example discussed in 'Advancing the hexapole $C_s$-corrector for the scanning transmission electron microscope', H. Müller, Microsc. Microanal. 12, pages 442-55, 2006 (further referred to as "Müller"), more specifically at page 446, most specifically at page 446, top of right column; and in "Correction of higher order geometric aberration by triple 3-fold astigmatism field", H. Sawada et al, Journal of Electron Microscopy, 2009, pages 1-7 (further referred to as "Sawada").

The invention intends to provide a corrector that is free of six-fold astigmatism, described by $A_5$.

The invention further intends to provide a corrector free of six-fold astigmatism, described by $A_5$ and free of sixth-order three-lobe aberration, described by $D_6$.

To that end a corrector according to the invention is characterized in that at least one additional multipole for generating at least one additional hexapole field is located between the first multipole and the second multipole, the at least one additional multipole in working not imaged on the first and the second multipole, the at least one additional hexapole field suited for correcting the six-fold astigmatism A5 of the corrector or sixth-order three-lobe aberration D6 of the corrector.

It can be shown that, by placing a weak additional hexapole at the cross-over, this hexapole can be used to tune $A_5$ to zero. It can also be shown that this additional hexapole can be used to tune $D_6$ to zero. As it is already known to the skilled person from e.g. Müller, page 452, right column, that a dodecapole at a position differing from the cross-over can be used to cancel A5, the combination of such a known dodecapole and the additional hexapole yield a corrector that can be tuned to be free of A5 and D6.

It is noted that the additional hexapole field is positioned at the cross-over. In that respect this corrector is differs from the corrector described in EP patent application No. EP20080252352, that uses three strong hexapoles to correct aberrations, the hexapoles rotated with respect to each other over 120 degrees and the middle hexapole twice as strong as the two hexapoles surrounding it. It also differs from EP patent No. EP941531, in which three hexapole fields (or more) are used for cancelling the spherical aberration itself, as well as coma.

In a preferred embodiment of the corrector according to the invention the at least one additional multipole is one multipole for generating one additional hexapole field, said additional hexapole field spatially overlapping the cross-over.

By placing the multipole at the cross-over, one hexapole field is sufficient to tune either $A_5$ or $D_6$ to zero, while the multipole does not introduce significant other aberrations, i.e. does not add A2, and a negligible amount of D4.

In another embodiment of the corrector according to the invention the at least one additional multipole are two multipoles for generating two additional hexapole fields, one of the two additional multipoles located between the cross-over and the first multipole and the other additional multipole located between the cross-over and the second multipole.

By placing two additional multipoles round the cross-over (preferably symmetrically round the cross-over), the same correction effect is achieved while the cross-over itself is kept available. In that way the cross-over becomes accessible, for example to add a rotation lens as described in e.g. U.S. Pat. No. 6,836,373 could be added.

This embodiment is especially attractive when combined with the Crewe corrector.

In another embodiment of the corrector according to the invention the optical system comprises round lenses.

Although it is known to use, for example, quadrupole lenses to form the optical system, a preferred embodiment of the corrector uses round lenses.

In another embodiment of the corrector according to the invention the multipoles are electrostatic multipoles.

Especially when using the corrector for correcting an objective lens focusing electrons with relatively low energies (e.g. with an energy below 30 keV) the use of electrostatic multipoles preferred, because e.g. electrostatic multipoles are free of hysteresis. It is noted that, when correcting an electrostatic objective lens focusing ions, the much larger mass of the ions necessitates the use of an electrostatic solution.

In another embodiment of the corrector according to the invention the optical system is an electrostatic optical system.

Especially when using the corrector for correcting an objective lens focusing electrons with relatively low energies (e.g. with an energy below 30 keV) the use of electrostatic multipoles is preferred, because e.g. electrostatic multipoles are free of hysteresis.

It is noted that, when correcting an electrostatic objective lens focusing ions, the much larger mass of the ions necessitates the use of an electrostatic solution.

In another embodiment of the corrector according to the invention the corrector further comprises multipoles for generating dipole and/or quadrupole fields and/or hexapole fields located between the first and the second multipole, or overlapping therewith, for correcting parasitic aberrations, including mechanical misalignments.

In another embodiment of the corrector according to the invention the lens system comprises only one thick lens for forming the cross-over and for imaging the first multipole on the second multipole.

Especially when using an electrostatic variant of the corrector according to the invention, it is attractive to use a thick lens, which forms a cross-over within the lens itself. Proper excitation results in a three tube lens (tubes connected to≈ground/potential/≈ground, with the two outer tubes forming the hexapoles) that image the hexapoles onto each other and forms a focus in the mid-plane.

In another embodiment of the corrector according to the invention the optical system consists of a single lens for imaging the first multipole on the second multipole and the third multipole spatially overlaps with the first lens.

It is noted that this corrector does not use Parallel In Parallel Out (PIPO) beam geometry. Transfer optics between corrector and objective lens may be used, but are not mandatory.

In a further embodiment of the corrector according to the invention the single lens between the hexapoles is a so-named double-gap lens, as a result of which anisotropic aberrations are strongly reduced.

In an aspect of the invention a particle-optical apparatus is equipped with a corrector according to the invention.

By equipping a Transmission Electron Microscope (TEM), a Scanning Transmission Electron Microscope (STEM), a Scanning Electron Microscope (SEM), a Focused Ion Beam instrument (FIB), or another particle-optical apparatus with a corrector according to the invention, A5 and/or D6 need not limit the performance of these apparatus.

In an embodiment of the particle-optical apparatus according to the invention transfer optics are placed between the corrector and the particle-optical lens, the transfer optics imaging the first multipole and the second multipole on or close to the coma-free plane of the particle-optical lens, or vice versa, as a result of which either C5 or the isotropic coma is zero.

In an embodiment of the apparatus the apparatus further comprises transfer optics to image the first and the second multipole on the objective lens, or vice versa.

In an aspect of the invention the use of a particle-optical apparatus equipped with a corrector according to the invention is characterized in that the additional multipole is excited such, that the corrector shows less A5 and/or D6 than without exciting the additional hexapole.

In an embodiment of the use of the particle-optical apparatus equipped with a corrector according to the invention the additional multipole is excited such, that A5 and/or D6 are reduced by at least 80%, more specifically 95%.

At these values it is found that errors other than A5 and/or D6 become limiting.

In another embodiment of the use of the particle-optical apparatus equipped with a corrector according to the invention the additional multipole is excited such, that aberrations other than A5 and/or D6 are dominant over A5 and/or D6.

BRIEF DESCRIPTION OF THE DRAWINGS

The invention is now described with reference to figures in which identical reference numerals denote corresponding elements. Here.

Figure 2:
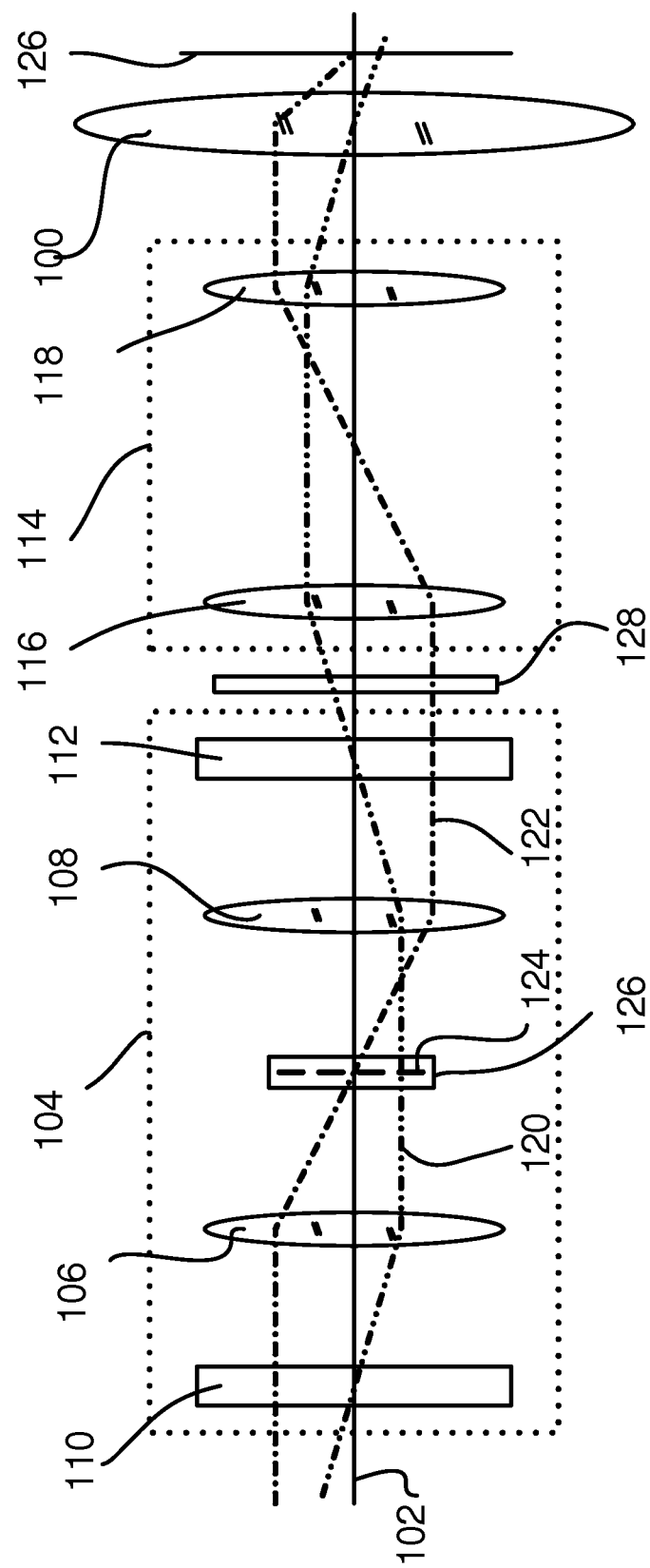
FIG. 2 schematically shows a Rose-like corrector according to the invention.
Figure 9:
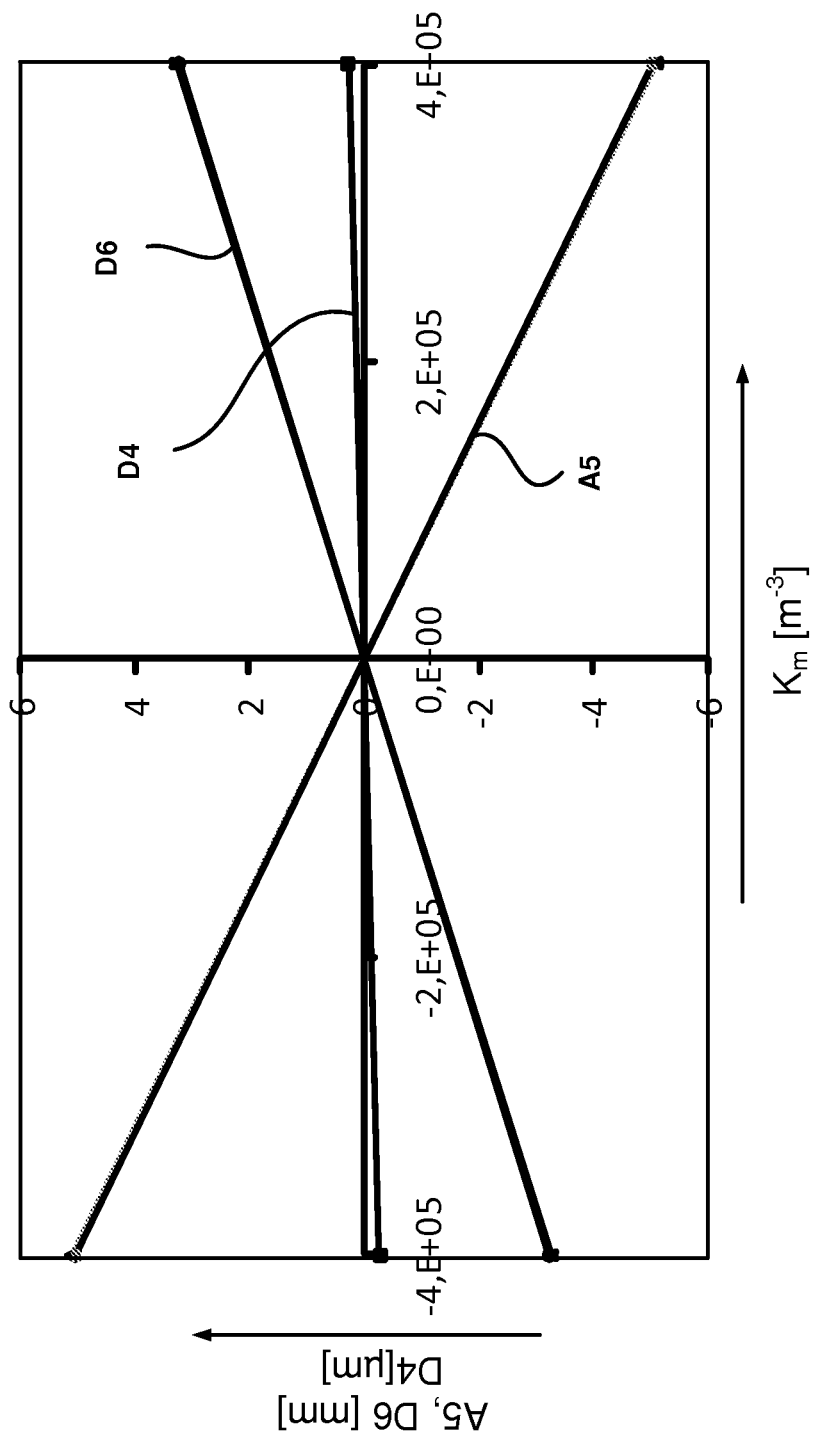

FIG. $7^a$ and FIG. $7^b$ schematically show an alternative double-gap lens and a sectional view of such a lens;

FIGS. $8^a$ and $8^b$ schematically shows an electrostatic variant of the Crewe-like corrector according to the invention and the ray in such a corrector;

FIG. 9 schematically shows simulation results for the Rose-like corrector shown in FIG. 2.

In the explanation and in the appendices reference is made to:

| Short reference | Full reference |
| --- | --- |
| The Rose corrector | U.S. Pat. No. 5,084,622 |
| Müller | "Advancing the hexapole $C_s$-corrector for the scanning transmission electron microscope", H. Müller, Microsc. Microanal. 12, 2006, pages 442-55 |
| Sawada | "Correction of higher order geometric aberration by triple 3-fold astigmatism field", H. Sawada et al., Journal of Electron Microscopy, 2009, pages 1-7 |
| Crewe | U.S. Pat. No. 4,389,571 |

Figure 1:
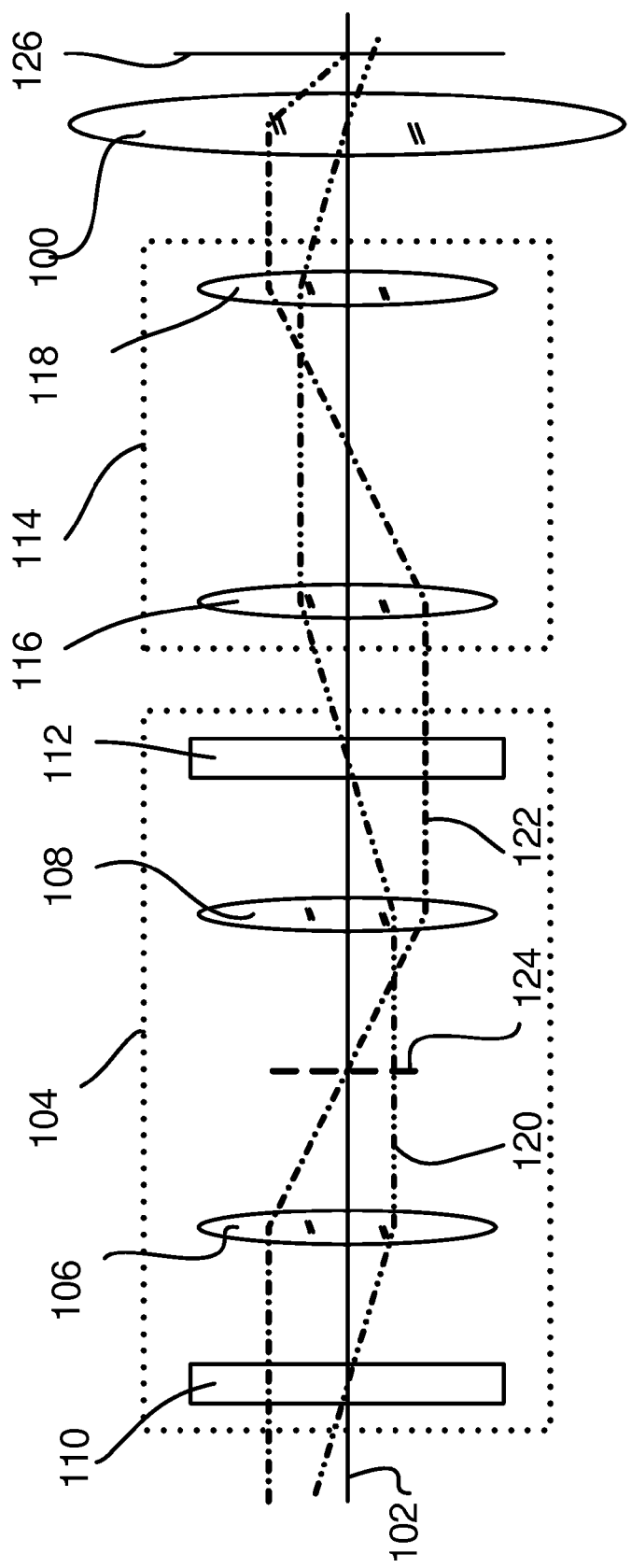
FIG. 1 schematically shows a Rose corrector.

FIG. 1 schematically shows a Rose corrector.

The Rose system corrects the aberrations of an objective lens 100. The objective lens, as well as the optical components discussed here, are centred round optical axis 102. The corrector is here explained in the situation where it focuses a beam of particles coming from the left of the figure on the objective lens shown on the right of the figure. In this position it corrects axial errors of the objective lens of a STEM, but the skilled person will recognise that, when used on the other side of the objective, it corrects axial aberrations of an imaging system as used, for example, in a TEM.

The objective lens is imaged on the corrector 104 with a so-named f/2f/f transfer lens doublet 114, formed by the lenses 116, 118.

A f/2f/f lens doublet is a system with two identical lenses, each with a focal length f, the lenses separated by a distance of 2f, and the object and image a distance f from the lenses. As known to the skilled person, such a doublet forms a telescopic system, in which a parallel incoming beam result in a parallel outgoing beam (parallel in, parallel out, or PIPO) with a magnification M=−1.

It is noted that the transfer lens doublet 114 is, as well as in much of the other literature, not considered part of the corrector 104.

The corrector 104 itself consists of two hexapoles, a first hexapole 110 and a second hexapole 112, with a f/2f/f corrector lens doublet 106, 108 between the hexapoles. The corrector lens doublet images the first hexapole on the second hexapole with a magnification of M=−1. It is noted that the focal length of the lenses used in this doublet need not be the same as the focal length of the lenses used in the transfer doublet 114.

Two principal rays are shown: the field ray 120 entering the first hexapole in the middle and the axial ray 122 entering the corrector parallel with the optical axis. This latter ray forms a cross-over in mid-plane 124 and forms a fine focus in object plane 126, where a sample to be inspected can be placed. It is remarked that mid-plane 124 of the corrector is thus a symmetry plane for the corrector.

As known to the skilled person, the mid-plane symmetry and the imaging conditions of the Rose corrector result in A2=D4=0 (for a definition of the aberration coefficients see appendix 1).

It is a known problem of the Rose corrector that A5 is not zero and limits the performance of the corrector, as mentioned and shown in Sawada and Müller.

As mentioned in Müller, page 442, right column, second paragraph, for the present design of hexapole correctors with only two multipole stages, the first uncorrected aberration is A5. The effect of A5 is shown in Sawada, FIG. 3.

Sawada continues at page 2, right column, that, since the fifth-order spherical aberration [C5 in the nomenclature used here] is of the order of only a few millimeters at most, this [aberration] is not a serious issue because it can be corrected by the transfer setting [of the transfer doublet] between the corrector and the objective lens.

This makes it clear that correcting A5 is necessary to further improve the correctors.

It is worth mentioning that Müller showed a partial solution in which Re(A5)=0 and Im(A5)≠0. This solution demands a given relation between the effective length L of the hexapoles, the anisotropic astigmatism $C_{ast}$ of the transfer optics between the hexapoles and the hexapole excitation, as discussed in formula [5.1] of appendix 5. Müller showed this solution by adapting an existing corrector. The resulting loss of a degree of freedom results in a higher excitation of the hexapoles than in the situation where Müller started, thus leading to higher dissipation and/or small bores and/or alignment problems of the hexapoles.

It is noted that this is, for an electrostatic corrector or a corrector using so-named double gap lenses (a lens showing two gaps, one with a magnetization in one direction and the other one with a magnetization in the other direction, resulting in $$\int_{-\infty}^{\infty} Bdz = 0),$$

which do not show imaginary A5, a total solution, even though a high hexapole excitation may still be necessary.

It is noted that a Rose like system with a further lens at the cross-over plane is known from U.S. Pat. No. 6,836,373. The further lens is used to correct rotation caused by the corrector doublet for different excitations of the doublet and to align the mutual rotational alignment of the hexapoles.

It is further noted that this is also known from a presentation given during the Conference of the Japanese Society of Electron Microscopy 2009, regarding the Crest R-005 microscope, which uses such a centre lens in a Rose-like corrector with an asymmetric transfer doublet (thus: magnification M<

>−1) between dodecapoles acting as hexapoles, as well as an asymmetric corrector lens doublet imaging the hexapoles on to the objective lens.

This shows that there are already many variants to the Rose corrector as originally described.

It is mentioned that Rose-like correctors are commercially available from the German company CEOS Gmbh, Heidelberg, Germany, and incorporated in commercially available electron microscopes, such as the Titan 80-300 with one or two correctors, from FEI Company, Hillsboro, USA.

It is further mentioned that in this context reference is made to a hexapole when a hexapole field is generated by a multipole. It is well-known to use, for example, a dodecapole to generate a hexapole field with arbitrary orientation. It is also known to use one multipole to generate a hexapole and to generate dipole and quadrupole field for aligning (elimination of parasitic aberrations).

FIG. 2 schematically shows a Rose-like corrector according to the invention.

The Rose-like corrector according to the invention resembles the Rose corrector shown in FIG. 1, but an additional hexapole 126 is placed at the cross-over plane. As shown in Appendix 5 the effect of this weak additional hexapole is that it can either cancel A5, or it can cancel (together with dodecapole 128) D6 and A5, although a slight D4 aberration is then still present. The real part of D4 can be tuned to zero by shifting the hexapoles slightly towards the lenses of the corrector doublet as shown in Appendix 3. The resultant Im(D4) is in the order of nanometers, which is completely negligible. It is noted that the dodecapole field of dodecapole 128 can be generated by a multipole that also generates another multipole field, for example hexapole 110. In that case the dodecapole 128 and the hexapole 110 overlap.

It is mentioned that the dodecapole should be placed at a position where the axial ray is not in focus.

It is further mentioned that, instead of one hexapole at the mid-plane, the skilled person will recognize that also two hexapoles surrounding the mid-plane will have an identical effect. Preferably these two hexapoles are then identical hexapoles arranged symmetrically round the mid plane, as a result of which the added A2=0. Also the use of more than two hexapoles may lead to the same result.

It is noted that, when two hexapoles are placed at one side of the mid-plane, the hexapoles should have opposite excitation.

It is mentioned that, as shown in appendix 4, for proper cancellation of some errors, more specifically D4, not the centre of the hexapoles should be imaged on each other, but a plane slightly removed from the mid-plane of the hexapoles. This can be achieved by, for example, a slight mechanical displacement of the hexapoles.

Figure 3:
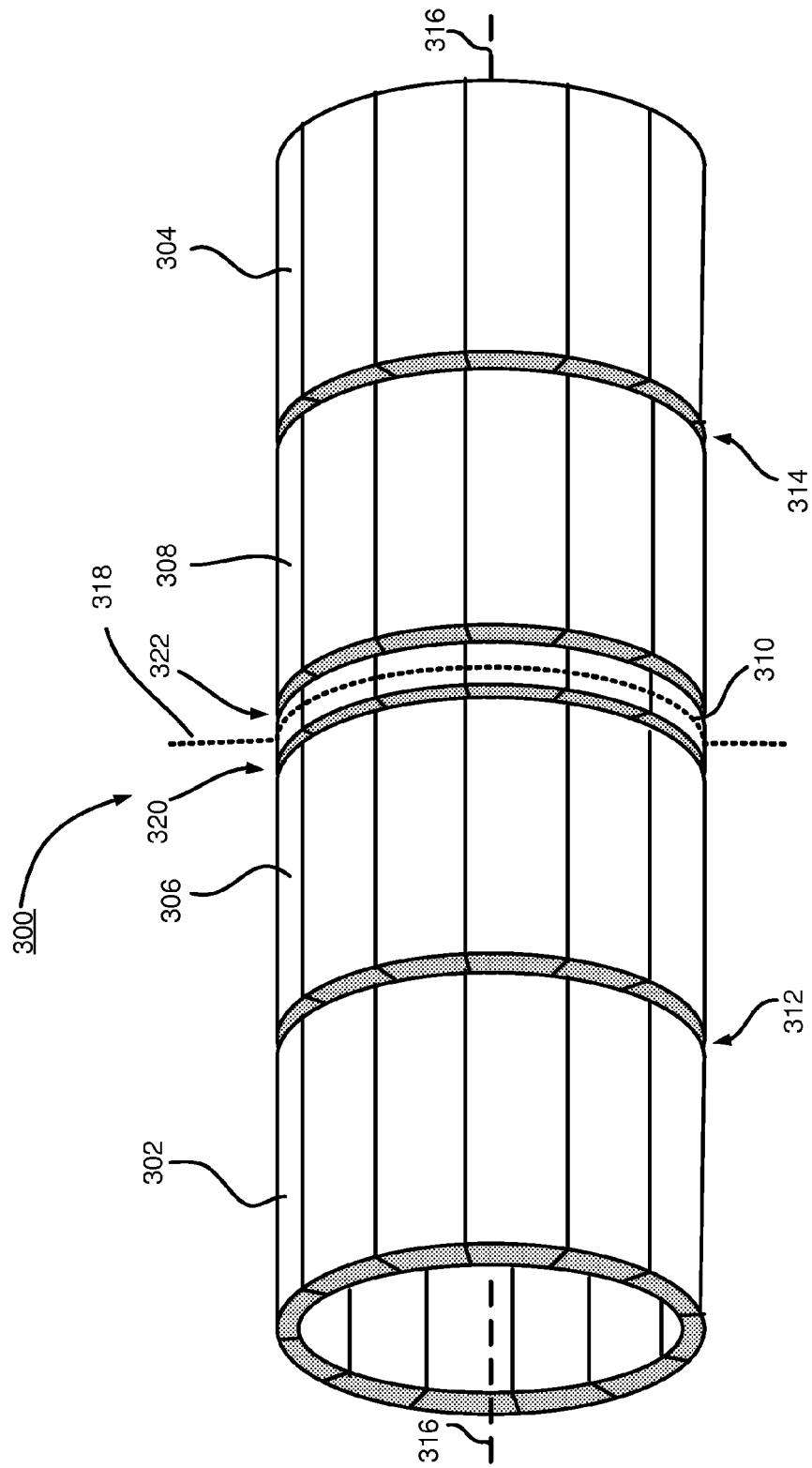
FIG. 3 schematically shows an electrostatic variant of the Rose-like corrector according to the invention.

FIG. 3 schematically shows an electrostatic variant of the Rose-like corrector according to the invention.

The whole corrector 300 is formed by a long dodecapole of which the electrodes are cut in sections.

Such an assembly can be made using e.g. spark-erosion, resulting in a high degree of alignment and diameter tolerances, and thus littler parasitic aberrations. As known to the person skilled in the art the spacing between electrodes and sections must be sufficient to withstand the voltage differences applied to the electrodes.

Sections 302 and 304 form the first and the second hexapole. All electrodes of lens sections 306 and lens section 308 are electrically tied together, and thus form effectively a hollow tube. Section 310 forms the additional hexapole. Plane 318 is the mid-plane, and also the symmetry plane of this corrector.

The electrodes of the first and the second hexapole are configured as a hexapole with voltages symmetrically with respect to ground, that is: the voltage on an electrode U equals $U=U_o \sin(n \phi)$, with n=3 for a hexapole and $\phi$ the angle with respect to the reference of the hexapole.

It is noted that it is also possible to realize a lens effect between the main hexapoles and the tubes by floating these hexapoles with respect to ground.

All electrodes of lens section 306 and lens section 308 are tied together, and thereby form a hollow tube. As known to the person skilled in the art such hollow tubes can be used to form electrostatic lenses by applying either an accelerating or a decelerating voltage to the tubes, resulting in acceleration or deceleration of the electrons travelling along optical axis 316. When accelerating the electrons at gap 312, and decelerating the electrons by the same amount in gap 314, a thick electrostatic lens is formed. By proper dimensioning of the electric field a lens can be formed that images the hexapoles onto each other. Identical results can be achieved by first decelerating the electrons at gap 312 and then accelerating them at gap 314.

The additional hexapole 310 'floats' at the same potential as the lens sections 306 and 308. Thereby no lens effect occurs between the sections 306 and 310 or sections 310 and 308.

It is noted that, as all elements can in principle be used as a dodecapole as well, the addition of a field for cancelling A5 can be integrated with, for example, one of the main hexapoles 302 or 304, or both (preferred due to symmetry). In that case a voltage $U=U_o \sin(n \phi)$, with n=6 for the dodecapole should be added to voltages already applied to the electrodes of the hexapole.

It is mentioned that an electrostatic corrector is free of anisotropic aberrations: all aberration coefficients have a real component only.

It is also mentioned that the corrector can be configured with the additional hexapole distributed over sections 306, 308 and 310. In that case there is no need to create a gap at positions 320 and 322.

It is further mentioned that the desired displacement of the hexapoles for cancellation of D4 (see appendix 4) can be achieved mechanically, but also by applying a small additional lens field to the additional hexapole electrodes with respect to the lens electrodes 306, 308 by adding or subtracting a lens voltage to all electrodes of the additional hexapole.

It is noted that small parasitic aberrations can be eliminated by exciting electrodes of the hexapoles and/or the lens electrodes to generate an additional dipole field and/or quadrupole field and/or hexapole field.

Figure 4:
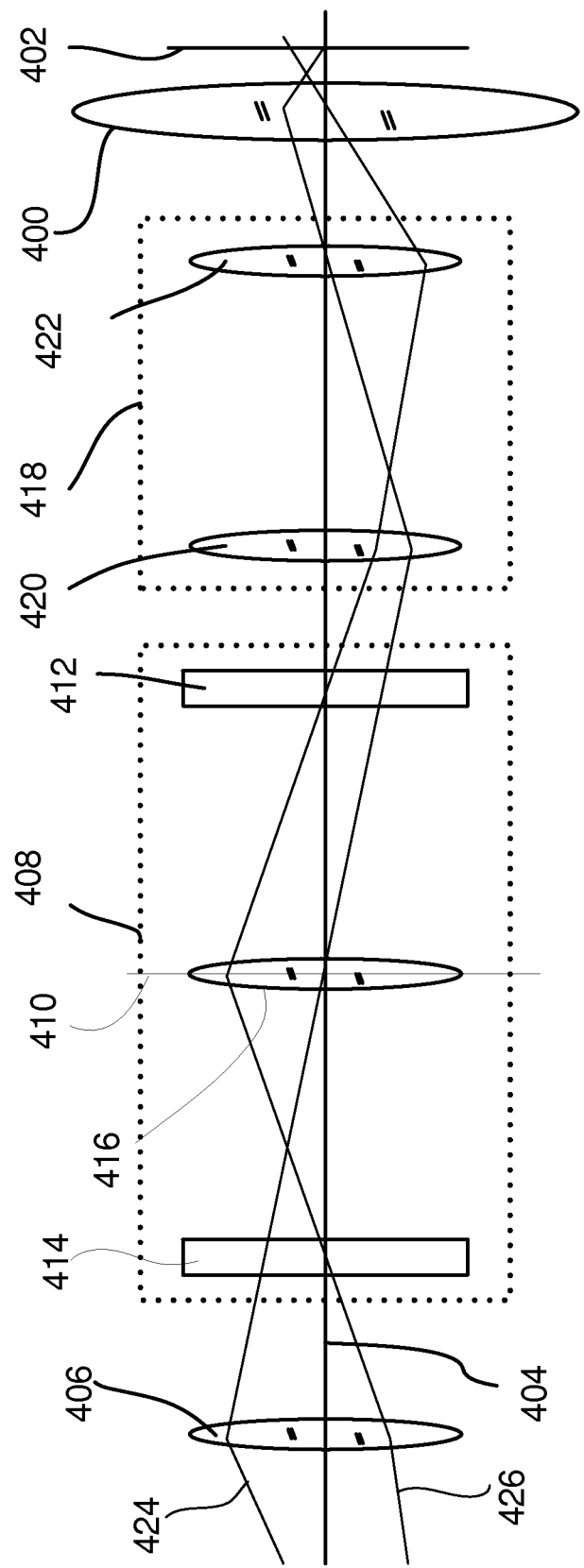
FIG. 4 schematically shows a Crew corrector.

FIG. 4 schematically shows a Crewe corrector.

The Crewe corrector is here described for a probe forming system, that is: a system placed between the beam source and the objective lens 400 irradiating an object 402 with the particles produced by the beam source. The objective lens then forms a finely focused probe on the optical axis 404 of, for example, electrons on the object. As known to the person skilled in the art, such a corrector can also be used for an imaging system by reversing the direction in which the beam travels through the corrector.

It is noted that the beam source enters the corrector via a condenser system, the last lens 406 of which is shown here.

A Crewe corrector 408 shows an axial cross-over of axial ray 424 in a symmetry plane 410 between two identical hexapoles 412, 414. In this symmetry plane a transfer lens 416 is placed imaging the first hexapole 412 on the second hexapole 414, as shown by principal ray 426.

It is noted that a slightly different imaging condition may be preferred to cancel Re(D4), equivalent to the displacement of the hexapoles derived for the Rose corrector. Here the different imaging condition can take the form of a different excitation of the transfer lens, resulting in a different focal strength.

It is further noted that extra D4, both Re(D4) and Im(D4), is introduced as a result of aberrations of the transfer lens. The real part Re(D4) can be cancelled by previously mentioned different imaging condition.

It is mentioned that proper use of a double gap lens reduces Im(D4) by more than 90%, or even by more than 99%, resulting in a negligible Im(D4). A double-gap lens shows two magnetized gaps, the first gap with a magnetization in one direction and the other in the opposite direction. As a result $\int_{-\infty}^{\infty} B \, dz$ can be made zero, resulting in a lens with very small anisotropic aberrations.

It is also mentioned that, although transfer optics 418 between the corrector and the objective lens is not necessary for reducing D4, it is necessary for cancelling C5 or cancelling isotropic coma. When using such transfer optics, e.g. a doublet comprising lenses 420 and 422, the planes of the hexapoles imaged upon each other should be imaged on the coma-free plane of the objective lens, i.e. principle ray 426 should cross the axis in the objective lens.

It is noted that when the corrector 408 is sandwiched between two lenses 420 and 406 for proper definition of the incoming and outgoing principal rays, it can be shown that the imaginary part of D4, Im(D4), can be cancelled when there is a modest overlap of each of the lens fields and the associated adjacent hexapole fields. A2 remains zero when the lenses and the amount of overlap is identical for the two lenses/hexapoles and the lens excitations are identical but of opposite sign.

It is mentioned that such a transfer system between the corrector and the objective lens can consist of a drift space, a single lens, a doublet, or even more complex lens systems, but that for correctors (be it Rose-like correctors or other types) a doublet is used widely mostly.

Figure 5:
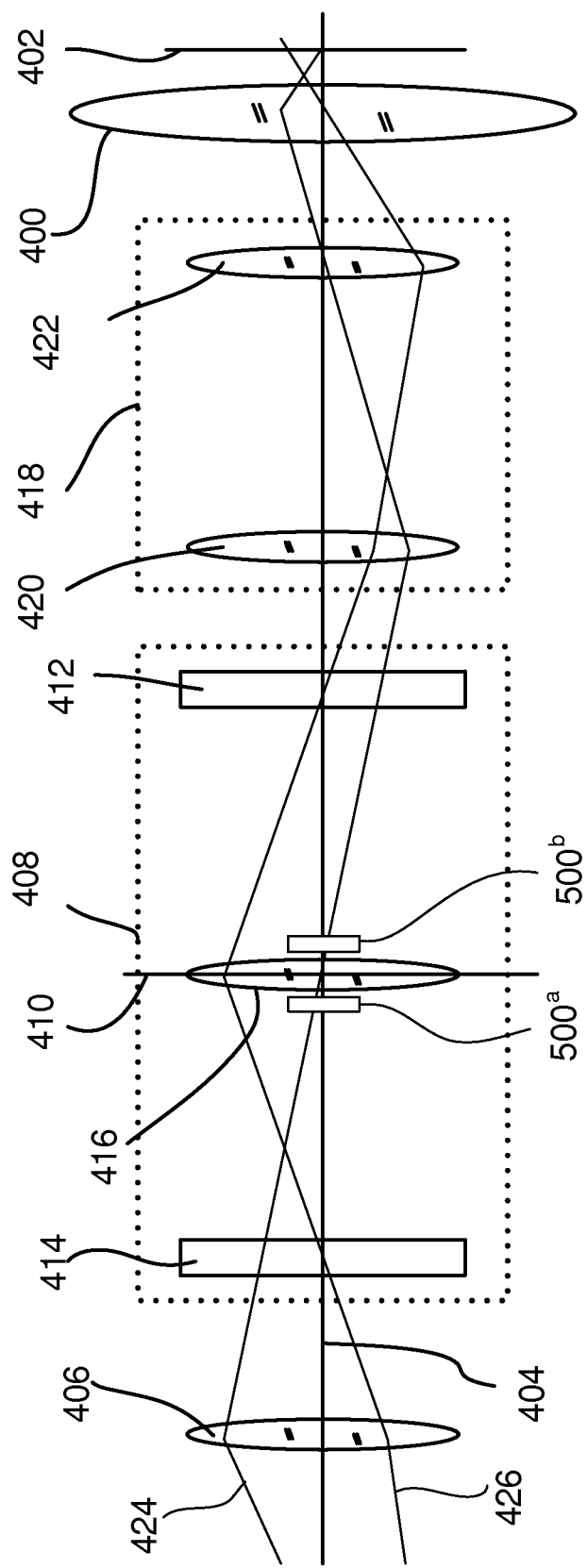
FIG. 5 schematically shows a Crew-like corrector according to the invention.

FIG. 5 schematically shows the Crewe like corrector according to the invention.

FIG. 5 can be thought to be derived from FIG. 4. The invention for the Crewe-like corrector is implemented by surrounding the transfer lens with two weak multipoles $500^a$, $500^b$. It can be shown in a similar way as for the Rose corrector, that A5 or D6 can be cancelled.

It is noted that identical, or almost identical, results can be obtained by superimposing the transfer lens and the hexapole. An alternative, equally suited, solution is by surrounding a weak hexapole 500 by two lenses functionally taking the place of the one transfer lens.

It is noted that the Crewe-like corrector is advantageously equipped with a double-gap lens, thereby reducing anisotropic aberrations of the imaging lens to a negligible value. Two such lenses are schematically shown.

Figure 6:
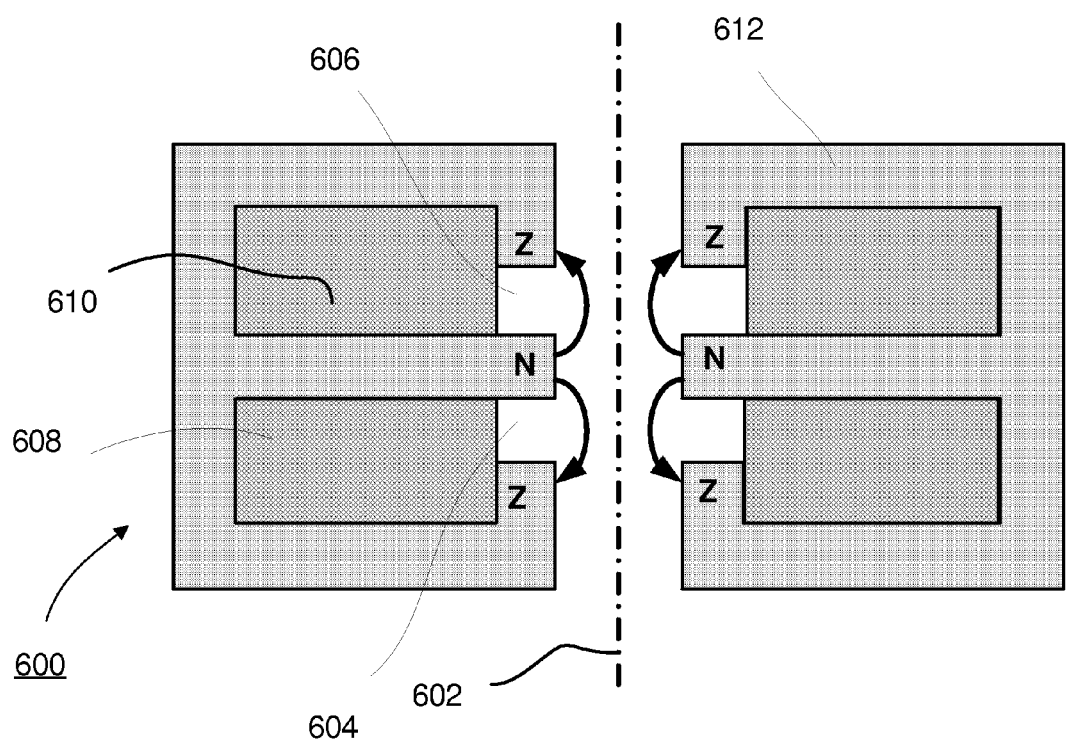
FIG. 6 schematically shows a double gap lens.
Figure 7A:
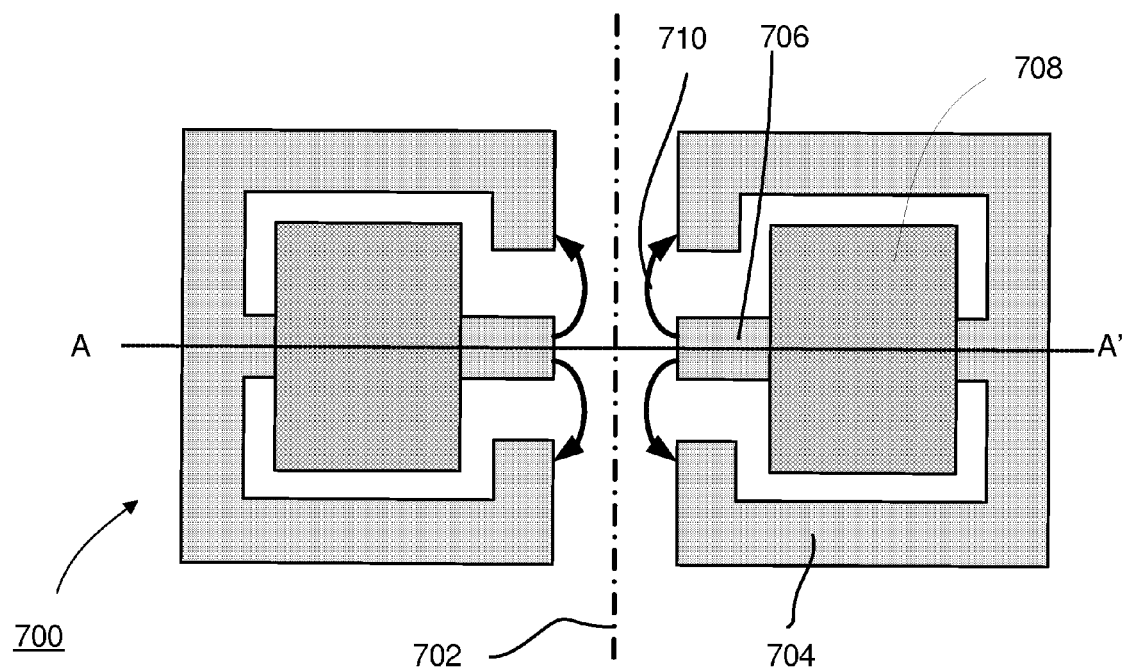
Figure 7B:
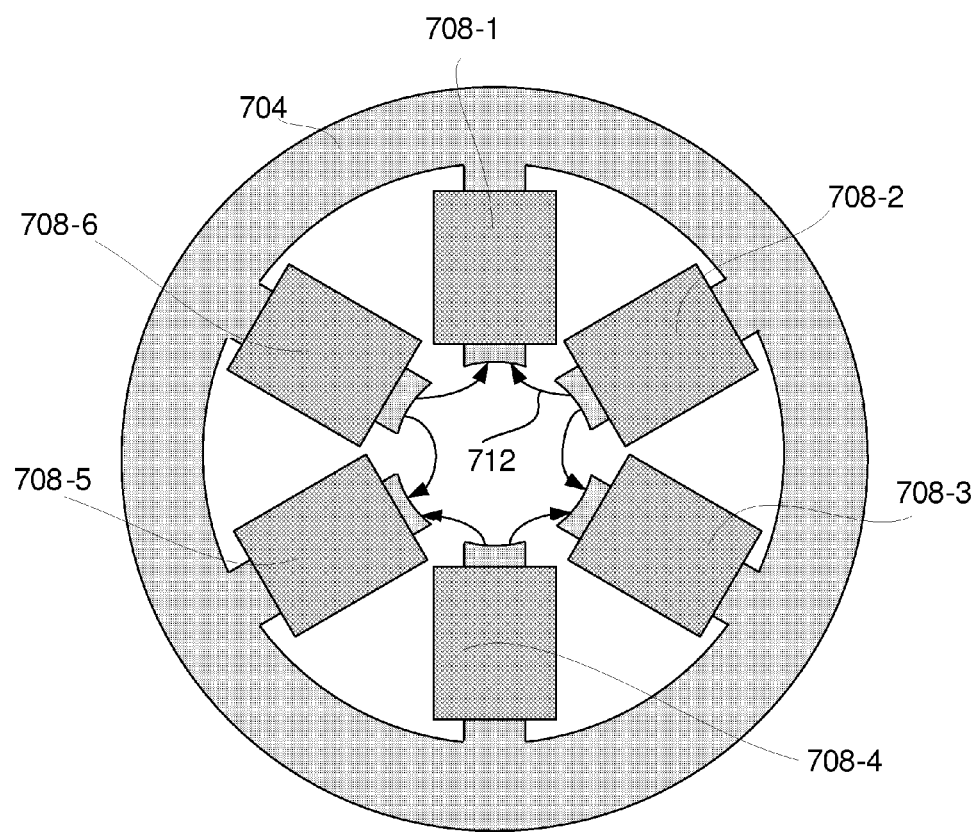
Figure 8A:
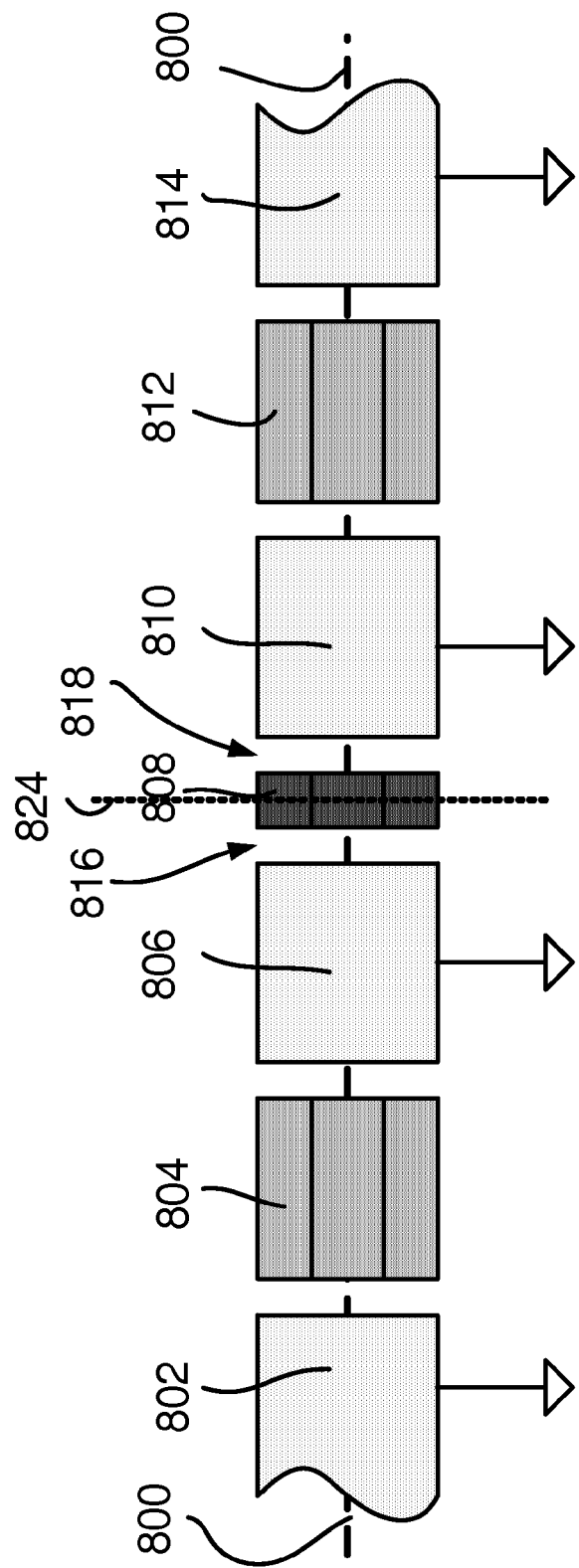
Figure 8B:
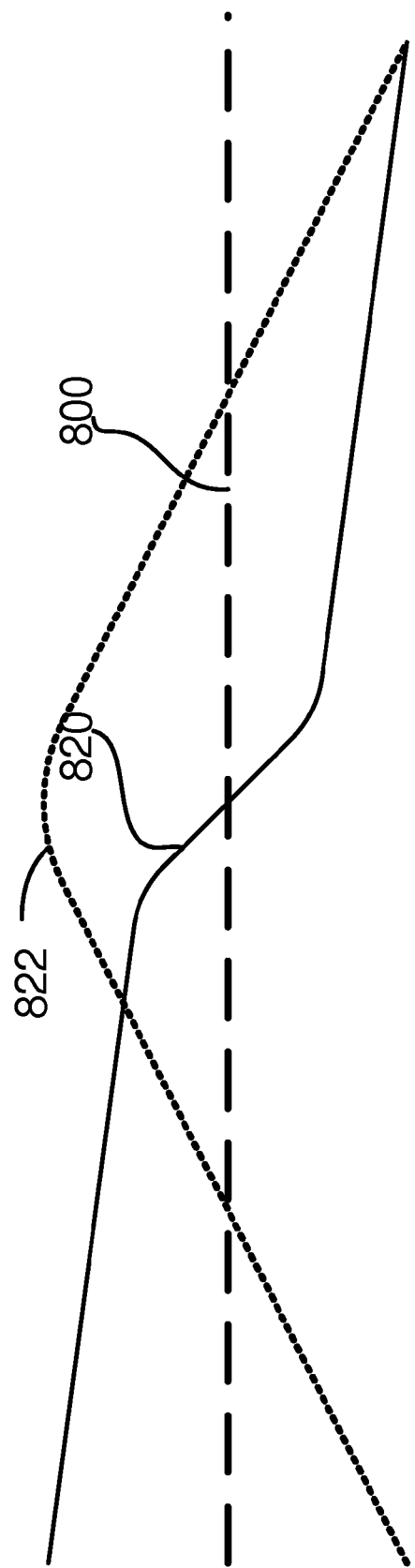

FIG. 6 schematically shows the well-known double-gap lens.

The double gap lens 600 shows rotational symmetry round optical axis 602. The yoke 612 of the lens shows two lens gaps 604, 606. The yoke is magnetized by two lens coils 608, 610. In this way the magnetic field in the first lens gap can be made equal to, but of opposite direction, to the magnetic field in the second lens gap. As a result $\int_{-\infty}^{\infty} B \, dz$ can be tuned to zero by properly choosing the ratio of the current in the first lens coil and the second lens coil. The anisotropic aberrations in the first lens gap will almost completely be compensated by the anisotropic aberrations of the second lens gap, resulting in much reduced anisotropic aberrations of the double gap lens.

FIGS. $7^a$ and $7^b$ schematically shows a double gap lens incorporating a magnetic hexapole. FIG. $7^b$ is a sectional view of the lens shown in FIG. $7^a$ along line AA'.

The double gap lens 700 can be thought to be derived from the double gap lens 600. Here however parts of the yoke 704 show symmetry round the optical axis 702, but the inner poles 706 show a six fold symmetry. Around each of these inner poles a coil 708-$i$ is applied. By now driving these coils with a similar current (both in amount of current and in direction of ampere-turns), a magnetization occurs resulting in a field 710 that has the same magnitude and direction for all poles. Small differences in the current of each of these poles results in a field 712 between each of the inner poles, resulting in a multipole field.

FIG. $8^a$ schematically shows an electrostatic Crewe-like corrector according to the invention, and FIG. $8^b$ schematically shows the principal rays for such a system.

This corrector shows symmetry around plane 824. A beam of electrons or ions emerge from a grounded tube 802 along axis 800. They then travel through a first hexapole 804 and enter a grounded tube 806. Leaving grounded tube 806 the charged particles are accelerated or decelerated, and enter the additional hexapole 808, which is floating at high voltage (the high voltage needed for accelerating or decelerating the electrons). Thereafter they are decelerated or accelerated to their original energy when entering grounded tube 810. Leaving tube 810 they then travel through hexapole 812 and finally enter grounded tube 814.

Hexapoles 804 and 812 are the hexapoles used for correcting the spherical aberration of the objective lens (objective lens not shown). The voltage on the electrodes of these two hexapoles is $U=U_\circ \sin(3\phi)$. The hexapole at the symmetry plane is 'floating' at a high voltage, and the voltage at the electrodes is thus $U=U_1+U_2 \sin(3\phi)$. As a result of the high voltage $U_1$ a focusing effect occurs between the hexapole and the grounded tubes surrounding the hexapole.

It is noted that this effect does not occur for the first and the second hexapole, as there is no DC voltage component for the first and the second hexapole.

FIG. $8^b$ schematically shows axis 800, the axial ray 820 that is formed into a cross-over in the symmetry plane and the field ray 822 showing that the first and the second hexapole are imaged upon each other.

FIG. 9 schematically shows simulation results for the Rose-like corrector shown in FIG. 2.

FIG. 9 schematically shows the calculated aberrations for D4 [μm], A5 [mm] and D6 [mm] in the specimen plane as a function of the mid-hexapole excitation parameter $k_m$ for a Rose like corrector. These are added aberrations, so an excitation of zero results in zero added aberrations, but an excitation different from zero should be used to correct the aberrations already introduced by the corrector.

The calculations are shown for two sets of simulations which however turned out to show a difference between the two sets too small to be visible in FIG. 9. Therefore the lines can be thought to represent either set.

One set represents the added aberrations using numerical simulations up to order 7, including hexapole fringe fields and transfer lens aberrations, while the other set is calculated using formula [4.1.2], [4.1.3] and [4.1.4]. The differences between the latter approximation (SCOFF, see appendix 2.1, and ignoring the aberrations of the transfer lenses, see appendix 5) and the first, more detailed set, are small: for D4 the difference is approximately 3.4%; for A5 the difference is approximately 1.3% and for D6 the difference is also 1,3%.

The following engineering parameters/dimensions are used:
focal length of the doublet lenses $f_t$=40 mm,
length of the first and second hexapole L=32 mm,
a length of the mid-hexapole of $L_m$=6 mm,
effective focal distance $\tilde{f}$=−2.1 mm,
excitation of first and second hexapole k=1,799·10$^6$ m$^{-3}$
excitation of mid-hexapole $k_m$=3in$\overline{\psi}_{3m}/\phi_r^{1/2}$=real.

The effective focal distance $\tilde{f}$ of the objective lens and the transfer optics (between corrector and objective lens), is defined via $u_{exit}$=−$\tilde{f}u'_i$, in which $u_{exit}$ equals the height with which the axial ray exits the corrector and $u_i'$ equals the angle at the image plane of the objective lens.

It is noted that $\tilde{f}$ can be positive or negative. A negative $\tilde{f}$ means that the axial ray has formed a cross over between the corrector and the objective lens It is noted that further simulations show that 2$^{nd}$ order off axial aberrations are not exactly zero, but that they are negligible with respect to the third-order off-axial aberrations.

It is worth mentioning that other simulations show that the use of the mid-hexapole not only results in reduced A5 and D6, but that also one or more off-axial aberrations, such as anisotropic astigmatism, can be reduced.

It is noted that in this invention there is often a reference to a hexapole, where a reference to a multipole generating a hexapole field can be substituted. Where in the claims reference is made to multipoles for generating hexapole fields, in the description often reference is made to hexapoles. The skilled person will see that both these phrases can be used for identical purposes.

Appendices

It is noted that for some parts of the following appendices the use of a mathematical program such as Mathematica 5.2, Wolfram Research Inc, Champaign, Ill., USA is strongly suggested.

It is further noted that, where appropriate as a result of a magnetic field along the axis, use is made of the rotating frame.

Appendix 1: Definition of Aberrations

Axial aberrations are here defined in a system with round lenses and hexapoles only. The axial aberrations up to order 7 are the Eikonal coefficients up to Seidel order N≤7 as defined in table 1. It is noted that these are identical to the axial aberration coefficient as mentioned in Müller, table 1.

TABLE A1.1

Eikonal coefficients for a straight-axis optical device with lenses and hexapoles only.

| | | Seidel order N | | | | | | | |
|---|---|---|---|---|---|---|---|---|---|
| | | 0 | 1 | 2 | 3 | 4 | 5 | 6 | 7 |
| Multiplicity | 0 | | C1 | | C3 | | C5 | | C7 |
| | 1 | B0 | | B2 | | B4 | | B6 | |
| | 2 | | A1 | | S3 | | S5 | | S7 |
| | 3 | | | A2 | | D4 | | D6 | |
| | 4 | | | | A3 | | R5 | | R7 |
| | 5 | | | | | A4 | | F6 | |
| | 6 | | | | | | A5 | | G7 |
| | 7 | | | | | | | A6 | |
| | 8 | | | | | | | | A7 |

Due to the three-fold symmetry of this system (the hexapoles showing a three-fold symmetry and the round lenses showing rotational symmetry), only aberration coefficients with multiplicity 0, 3, 6, . . . can be nonzero. These are:

Multiplicity=0: C1, C3, C5, C7,
Multiplicity=3: A2, D4, D6
Multiplicity=6: A5, G7, It is noted that this system is a perfectly aligned system, otherwise also errors with other multiplicity (2, 4, 6, 8, . . . ) are non-zero.

It is mentioned that coefficients of multiplicity 0 are real, all others are in general complex.

It is mentioned that in a Rose corrector, due to the mid-plane symmetry of the corrector doublet and the imaging conditions, A2 and D4 of the corrector are zero. Müller mentions at page 442, right column, second indent, that the first uncorrected residual intrinsic aberration is the fifth-order six-fold astigmatism (A5), making it the only limiting fifth-order axial aberration.

It is further noted that, due to the different symmetry and imaging conditions, the Crewe corrector shows D4.

It is mentioned that Sawada uses another nomenclature for the aberration coefficients. In Sawada at page 6, appendix 1, a table is given of the aberration coefficients uses there. Table 2 gives a 'translation' table between the nomenclature used in table 1 and the nomenclature used by Sawada.

TABLE A1.2 translation table between the nomenclature in the Eikonal system versus the nomenclature in Sawada.

| Eikonal aberration name | Eikonal coefficient | Sawada | Sawada aberration name |
|---|---|---|---|
| Defocus | C1 | O2 | Defocus |
| Two-fold axial astigmatism | A1 | A2 | Two-fold astigmatism |
| Second order axial coma | B2 | P3 | Axial coma |
| Three-fold axial astigmatism | A2 | A3 | Three-fold astigmatism |
| Third order spherical aberration | C3 | O4 | Spherical aberration |
| Third order star aberration | S3 | Q4 | Star aberration |
| Four-fold axial astigmatism | A3 | A4 | Four-fold astigmatism |
| Fourth-order axial coma | B4 | P5 | Fourth-order axial coma |
| Fourth-order three-lobe aberration | D4 | R5 | Three-lobe aberration |
| Five-fold axial astigmatism | A4 | A5 | Five-fold astigmatism |
| Fifth-order spherical aberration | C5 | O6 | Fifth-order spherical aberration |
| Six-fold axial astigmatism | A5 | A6 | Six-fold astigmatism |

Appendix 2: Ray Equations for a Rose Corrector with Thick Magnetic Hexapoles

Appendix 2.1: The Ray Equations for a Thick Magnetic Hexapole

The ray equations for a thick magnetic hexapole, that is: the effect of a hexapole with non-negligible length on the trajectory of an electron, in SCOFF (Sharp Cut-Off of Fringe Fields) approximation is described by Sawada at page 2, paragraph "Correction of higher order geometric aberrations."

In Sawada's formulae [2a], [2b] the ray equation for a thick magnetic hexapole is given, while Sawada's formulae [3a], [3b] give the ray equation for a Rose system including the effect of the correction doublet is given.

Here a slightly different notation is used, which correspond to Sawada's formulae, in which the following substitution is made (left Sawada, right the substitution): $\tilde{A}_3/f^3$=−k and $f\omega_0$=$u_0$ ($u_0$=$x_0$+$iy_0$, ($x_0$, $y_0$) position of the particle entering the hexapole parallel to the optical axis in Cartesian coordinates) and referring to z=L.

The excitation of a magnetic hexapole is more properly defined by $$k = \frac{3\hat{\eta}\overline{\psi}_3}{\varphi_r^{1/2}},\quad [A2.1.1]$$

in which $$\psi = \text{Re}[\psi_3(z)\, u^3] = (\psi_3 u^3 + \overline{\psi}_3 \overline{u}^3)/2$$

the scalar magnetic potential, $\eta=\sqrt{e/(2m_e)}$, $\phi$ the electrostatic potential (which is defined to be zero at the source) and $\phi_r = \phi(1+\epsilon\phi) = \phi(1+e\phi/(2mc^2))$ the relativistic potential.

The resultant formula at the end of a hexapole (so: at z=L) is then:

$$u[u_0, u'_0] = u_0 + \frac{kL^2}{2}\overline{u}_0^2 + \frac{|k|^2 L^4}{12}u_0^2\overline{u}_0 + \frac{k\overline{k}^2 L^6}{120}u_0^4 + \quad [A2.1.2^a]$$
$$+ \frac{k^2\overline{k}L^6}{180}u_0\overline{u}_0^3 + \frac{17|k|^4 L^8}{10080}u_0^3\overline{u}_0^2 + \frac{k^3\overline{k}L^8}{3360}\overline{u}_0^5 +$$
$$u'_0 L + \frac{kL^3}{3}\overline{u}_0 u'_0 + \frac{kL^4}{12}\overline{u}_0'^2 + \frac{|k|^2 L^5}{30}u_0\overline{u}_0 u'_0 +$$
$$\frac{|k|^2 L^5}{20}u_0^2 \overline{u}'_0 + \frac{|k|^2 L^6}{180}\overline{u}_0 u'_0{}^2 + \frac{|k|^2 L^6}{45}u_0 u'_0 \overline{u}'_0 +$$
$$\frac{k\overline{k}^2 L^7}{126}u_0^3 u'_0 + \frac{k^2\overline{k}L^7}{420}\overline{u}_0^3 u'_0 + \frac{k^2\overline{k}L^7}{180}u_0\overline{u}_0^2\overline{u}'_0 + \ldots$$

and $$u'[u_0, u'_0] = du/dL \quad [A2.1.2^b]$$

These formula correspond with Sawada's formula [2a] and [2b].

It is noted that this formula is expanded to a slightly larger number of terms, leading to a different approximation.

It is further noted that the C3-correcting power of hexapole correctors originates from the third order slope aberration $$u' = \frac{|k|^2 L^3}{3} u_0^2 \overline{u}_0.$$

Appendix 2.2: The Ray Equations for One Hexapole, Via the Transfer Doublet to the Second Hexapole As known to the person skilled in the art a telescopic doublet with magnification −1 has a transfer matrix $$T = -1 \quad [A2.2.1]$$

in which 1 is the unit matrix.

This describes a system with a first drift space with length f, followed by a lens with focal length f, a second drift space with length 2f, a lens with focal length f, and a third drift space with length f. This is consistent with a PIPO system with magnification M=−1.

However, the doublet images the middle of one hexapole on to the middle of the other hexapole, while ray equations [A2.1.2] describe the output of a hexapole at z=L. Likewise the second hexapole already starts before the mid-plane of that hexapole, This can be accounted for by shortening the first and third drift space by a length L/2, resulting in a transfer matrix $$T = \begin{pmatrix} -1 & L \\ 0 & -1 \end{pmatrix} \quad [A2.2.2]$$

When combining formula [A2.1.2] with this transfer matrix of formula [A2.2.2] instead of the matrix given in [A2.2.1], and back-tracing to the middle of the hexapole closest to the objective lens, this results in $$u_{exit} = -u_0 + \frac{L^6}{30}k\overline{k}^2 u_0^4 - \frac{4L^6}{45}k^2\overline{k}u_0\overline{u}_0^3 \quad [A2.2.3^a]$$

and $$u'_{exit} = -\frac{2L^3}{3}k\overline{k}u_0^2\overline{u}_0 + \frac{2L^7}{21}k^2\overline{k}^2 u_0^3\overline{u}_0^2 - \frac{L^7}{14}k^3\overline{k}\overline{u}_0^5 \quad [A2.2.3^b]$$

equivalent to Sawada's formula [3a] and [3b].

It is noted that Sawada does not refer to the same plane, that is: not to the middle of the hexapole closest to the objective lens It is further noted that the aberrations introduced by the corrector transfer doublet are neglected.

The corrector is followed by a transfer doublet between corrector and objective lens. Of the different terms of [A2.2.3$^b$] the third order exit slope aberration $$-\frac{2L^3}{3}k\overline{k}u_0^2\overline{u}_0$$

results into a negative C3 at the image plane of the objective lens, the term $$\frac{2L^7}{21}k^2\overline{k}^2 u_0^3\overline{u}_0^2$$

results in C5 and the term $$-\frac{L^7}{14}k^3\overline{k}\overline{u}_0^5$$

results in A5, respectively, in the image plane of the objective lens.

To illustrate how these terms convert to aberrations in the image plane of the objective lens, it is convenient to define an effective focal distance f of the objective lens and the transfer optics (between corrector and objective lens), which is defined via $u_{exit}=-\hat{f}u'_i$, where $u_{exit}$ is the height at which the axial ray exits the corrector and $u_i'$ is the angle at the image plane of the objective lens.

It is noted that f can be positive or negative.

The third order slope aberration at the exit of the corrector is given by $$u'_{exit} = -C_3^{(slope)} u_0^2 \overline{u}_0 = C_3^{(slope)} u_{exit}^2 \overline{u}_{exit} \quad [A2.2.4]$$

with $$C_3^{(slope)} = \frac{2L^3}{3}|k|^2$$

and in the image plane of the objective lens the corrector contribution to the spherical aberration is given by $$\delta u_i = C3 \cdot u_i'^2 \cdot \overline{u}_i' \quad [A2.2.5]$$

with $$C3 = C_3^{(slope)} \bar{f}(-\bar{f})^3 = -2|k|^2 L^3 \bar{f}^4/3.$$

Similarly, six-fold astigmatism can be written as $$u'_{exit} = A_5^{(slope)} \bar{u}_{exit}^5 \quad [A2.2.6]$$

with $A_5^{(slope)} = k^3 \bar{k} L^7/14$. In the image plane of the objective lens $$\delta u_i = A5 \cdot \bar{u}'^5_i, \text{ with } A5 = -A_5^{(slope)} \bar{f}^6 = -k^3 \bar{k} L^7 \bar{f}^6/14.$$

It is noted that for Rose-like correctors with non-PIPO illumination (either incoming, outgoing, or both) similar formulae can be derived.

Appendix 3: Ray Equations for a Rose Corrector with Thick Electrostatic Hexapoles For electrostatic hexapoles the ray equation, in non-relativistic approximation, is given by:

$$u'' = -\frac{1}{2\varphi}(1 + u'\bar{u}')E$$

with $$\varphi = \varphi_0 + (\varphi_3 u^3 + \bar{\varphi}_3 \bar{u}^3)/2$$

and $$E = -3\bar{\varphi}_3 \bar{u}^2.$$

The hexapole field starts at $z=0$ and ends at $z=L$. We define the complex constant $$k = \frac{3\bar{\varphi}_3}{2\varphi_0},$$

hence:

$$u'' = \left(1 + \frac{1}{3}\bar{k}u^3 + \frac{1}{3}k\bar{u}^3\right)^{-1} k(1 + u'\bar{u}')\bar{u}^2 \quad [A3.1]$$

$$\approx \left(1 + u'\bar{u}' - \frac{1}{3}\bar{k}u^3 - \frac{1}{3}k\bar{u}^3\right)k\bar{u}^2$$

At $z=L$ this yields:

$$u[u_0, u'_0] = u_0 + \frac{kL^2}{2}\bar{u}_0^2 + \frac{|k|^2 L^4}{12} u_0^2 \bar{u}_0 + \frac{k\bar{k}L^6}{120} u_0^4 + \quad [A3.2a]$$

$$\frac{k^2 \bar{k} L^6}{180} u_0 \bar{u}_0^3 + + \frac{(17|k|^4 L^8 - 1680|k|^2 L^2)}{10080} u_0^3 \bar{u}_0^2 +$$

$$\frac{(k^3 \bar{k} L^8 - 560 k^2 L^2)}{3360} \bar{u}_0^5 + + u'_0 L + \frac{kL^3}{3} \bar{u}_0 u'_0 +$$

$$\frac{kL^4}{12} \bar{u}_0'^2 + \frac{|k|^2 L^5}{30} u_0 \bar{u}_0 u'_0 + \frac{|k|^2 L^5}{20} u_0^2 \bar{u}_0' +$$

$$\frac{|k|^2 L^6}{180} \bar{u}_0 u_0'^2 + + \frac{|k|^2 L^6}{45} u_0 u'_0 \bar{u}'_0 + \frac{k\bar{k}L^7}{126} u_0^3 u'_0 +$$

$$\frac{k^2 \bar{k} L^7}{420} \bar{u}_0^3 u'_0 + \frac{k^2 \bar{k} L^7}{180} u_0 \bar{u}_0^2 \bar{u}'_0 + \ldots$$

and $$u'[u_0, u'_0] = du/dL. \quad [A3.2b]$$

This is same result as for the magnetic case, except for two extra terms for the fifth order axial aberrations.

For electrostatic hexapoles, the term leading to A5 in the image plane of the objective lens is then $$A_5^{(slope)} = \frac{1}{14} k^3 \bar{k} L^7 - \frac{2}{3} k^2 L \quad [A3.3]$$

Appendix 4: Effect of Slight Displacement of the Hexapoles in a Rose-like Corrector By displacing the hexapoles by a small distance $\epsilon/2$ towards the symmetry plane of the Rose corrector, the transfer matrix given in [A2.3] becomes:

$$T_h = \begin{pmatrix} -1 & L+\varepsilon \\ 0 & -1 \end{pmatrix} \quad [A4.1]$$

The resultant exit slope, up to first order in $\epsilon$ and up to fourth order in $(u_0, \bar{u}_0)$ is then $$u'_{exit} = -|k|^2 \left(\frac{2}{3} L^3 + 2L^2 \varepsilon\right) u_0^2 \bar{u}_0 + \frac{1}{3} k\bar{k}^2 L^4 \varepsilon u_0^4. \quad [A4.2]$$

Referring to the exit plane, the aberrated exit position, up to first order in $\epsilon$ and up to third order in $(u_0, \bar{u}_0)$, is:

$$u_{exit} = -u_0 + kL\varepsilon \bar{u}_0^2 + \frac{1}{3}|k|^2 L^3 \varepsilon u_0^2 \bar{u}_0. \quad [A4.3]$$

Inversion of the Taylor series for the exit position yields $$u_0 = -u_{exit} + kL\varepsilon \bar{u}_{exit}^2 \alpha \quad [A4.4]$$

which, inserted into the equation for the exit slope, results in $$u'_{exit} = |k|^2 \left(\frac{2}{3} L^3 + 2L^2 \varepsilon\right) u_{exit}^2 \bar{u}_{exit} - \frac{\varepsilon L^4}{3}\left(k\bar{k}^2 u_{exit}^4 + 4k^2 \bar{k} u_{exit} \bar{u}_{exit}^3\right) \quad [A4.5]$$

This can be written as $$u'_{exit} = 2\frac{\partial}{\partial \bar{u}_{exit}} \text{Re}\left[\frac{1}{4} C_3^{(slope)} u_{exit}^2 \bar{u}_{exit}^2 + D_4^{(slope)} u_{exit}^4 \bar{u}_{exit}\right] \quad [A4.6]$$

with $$C_3^{(slope)} = |k|^2 \left(\frac{2}{3} L^3 + 2L^2 \varepsilon\right) \quad [A4.7]$$

and $$D_4^{(slope)} = -\frac{\varepsilon L^4}{3} k \bar{k}^2 \quad [A4.8]$$

The fourth order aberration in the image plane of the objective lens is thus given by $$\delta u_i = 2 \frac{\partial}{\partial \bar{u}_i'} \text{Re}[D4 \cdot u_i'^4 \cdot \bar{u}_i'] \qquad [A4.9]$$

with $$D4 = D_4^{(slope)} \tilde{f}(-\tilde{f})^4 = -\varepsilon L^4 k \bar{k}^2 \tilde{f}^5 / 3 \qquad [A4.10]$$

Appendix 5: Effect of Aberrations of the Correctors' Transfer Optics in a Rose Corrector
Definitions:

The asymptotic object plane of the transfer optics is the centre of the first hexapole, the asymptotic image plane of the transfer optics is the centre of the second hexapole; $u_i$ and $u_i'$ are (Gaussian) position and slope in the latter plane.

In terms of these parameters, image side off-axial astigmatism is given by $\delta u_i = C_{ast} u_i^2 \bar{u}_i'$, where $C_{ast}$ is in general complex. This coefficient also features in the slope aberrations, i.e. $\delta u_i' = -C_{ast} \bar{u}_i u_i'^2$.

Similar and well-known expressions can be derived for the other off-axial aberrations, i.e. field curvature, coma and distortion.

When the transfer lenses between hexapoles are mid-plane symmetric, and the excitations are equal but with opposite sign, then the total lens rotation equals zero. Because of these symmetries, distortion and coma are zero.

It is noted that nonzero distortion would have contributed to D4.

Appendix 5.1: Combination Aberrations Between Two Hexapoles and Transfer Optics The aberrations of the transfer optics slightly changes C3 and C5. The effect of that is negligible since the sum of C3 and C5 for the whole system can always be tuned to zero. The important effect of the transfer optics is its contribution to A5, via the (complex) astigmatism coefficient $C_{ast}$:

$$u_{exit}' = \ldots + \left(-3L^2 \bar{C}_{ast} + \frac{1}{14}|k|^2 L^7\right) k^2 \bar{u}_{exit}^5 \qquad [5.1]$$

It is noted that Müller found a partial solution for reducing A5 by choosing a particular length L and excitation k for which the real part of A5=0, that is: $(3L^2 \bar{C}_{ast} = |k|^2 L^7 / 14)$. The resulting A5 is then imaginary, and scales with the anisotropic astigmatism ($\text{Im}[C_{ast}]$) of the transfer optics. Müller demonstrated this by modifying an existing corrector, and found that this particular length was shorter than the length which was used previously. He ended up with a short hexapole.

It is further noted that in an electrostatic variant of the Rose corrector, all aberrations are isotropic, so in particular $\text{Im}[C_{ast}]=0$, and hence it is possible to design a hexapole corrector with A5=0, by choosing hexapole length L and excitation k suitably.

It is worth mentioning that in a magnetic design, transfer lenses of the so-named double-gap lens type can be used to achieve a large reduction of $\text{Im}[C_{ast}]=0$ and hence A5. A double-gap lens shows two magnetized gaps, the first gap is magnetized in one direction and the other in the opposite direction. As a result $\int_{-\infty}^{\infty} B \, dz$ can be made zero.

In both cases, one ends up with said short hexapoles or small excitation, i.e. small |k|. A small excitation has the disadvantage that the contribution of the corrector to $C_c$ (axial chromatic aberration coefficient) is large.

It is further mentioned that long hexapoles show advantages because, for a given corrector-C3, the required hexapole excitation k scales with $L^{-3/2}$. As known to the skilled person this implies that for increasing hexapole length the hexapole bore increases and/or the hexapole excitation (either Volts for an electrostatic hexapole or Ampere-turns for a magnetic multipole) decreases, leading to a more practical design.

Another reason why long hexapoles are preferred is that a long hexapole has lower demands on relative stability of k. This can be shown as follows: consider the effect of a fluctuating hexapole field vs. hexapole length, keeping corrector-C3 constant. It is assumed that independent power supplies are used for both hexapoles.

Slope aberrations of one hexapole, using previously defined $C_3^{(slope)}$:

$$u' = kL\bar{u}_0^2 + \frac{|k|^2 L^3}{3} u_0^2 \bar{u}_0 \equiv A_2^{(slope)} \bar{u}_0^2 + \frac{1}{2} C_3^{(slope)} u_0^2 \bar{u}_0 \qquad [5.2]$$

Fluctuating k leads to fluctuating 3-fold astigmatism via $$\delta A_2^{(slope)} = L\delta k = |k|L \cdot (\delta k/|k|) = (3C_3^{(slope)}/2)^{1/2} L^{-1/2} \cdot (\delta k/|k|) \qquad [5.3]$$

where $(\delta k/|k|)$ is the relative instability of the hexapole field. If we vary the hexapole length L, while not changing the corrector-C3 and the optics behind the corrector, then the effect of this instability on the probe size scales with $L^{-1/2} \cdot (\delta k/|k|)$, showing the advantage of using long hexapoles.

Appendix 6: Effect of Mid-hexapole in a Rose Corrector

The invention is first derived for a magnetic hexapole ignoring the contribution of lens aberrations of the corrector doublet.

With $L_m$ the length of the mid-hexapole, $$k_m = \frac{3i\eta \bar{\psi}_{3m}}{\varphi_r^{1/2}}$$

the excitation parameter (see formula [A2.1.1]) of the mid-hexapole, and $f_t$ the focal length of each lens of the f/2f/f doublet, the distance between first and second hexapole centres equals $4 \cdot f_t$.

It is sufficient to calculate the effect of the mid-hexapole in first order in $k_m$, since it is a weak hexapole and it is positioned at an axial crossover.

It is noted that, although the aberrations of each of the hexapoles is only determined up to the fifth order, the combination aberrations are calculated up to the sixth order in $u_0$ and $\bar{u}_0$.

It is further noted that, for this derivation, it is easiest to work with a drift space from the first hexapole to the mid-plane of the mid-hexapole, then the mid-hexapole itself, and then another drift space from the mid-plane of the mid-hexapole to the second hexapole, resulting in a transfer matrix to be used in formula [6.4] of $$T_{half} = \begin{pmatrix} 0 & f_t \\ -1/f_t & 0 \end{pmatrix}$$

Aberrations are evaluated asymptotically in the mid-plane of the second hexapole, using back-extrapolation from the thick hexapole formula to the mid-plane of said hexapole. Only axial aberration coefficients are calculated.

It can be derived that, due to the mid-hexapole, there is a very small second order position aberration in the exit plane:

$$u_{exit} = -u_0 + \frac{k_m L_m^3}{12 f_t} \bar{u}_0^2 + \ldots \quad [6.1]$$

Slope aberrations are again expressed in terms of $u_{exit}$ (using additional terms not given in 6.1). The terms which are linear in $k_m$ or $\bar{k}_m$ only, i.e. those showing only the change due to the mid-hexapole, are:

$$\Delta u'_{exit} = 2\frac{\partial}{\partial \bar{u}_{exit}} \text{Re}\left[\frac{1}{4}\Delta C_3^{(slope)} u_{exit}^2 \bar{u}_{exit}^2 + \right. \quad [6.2]$$
$$\left. \Delta D_4^{(slope)} u_{exit}^4 \bar{u}_{exit} + +\frac{1}{6}\Delta C_5^{(slope)} u_{exit}^3 \bar{u}_{exit}^3 + \frac{1}{6}\Delta A_5^{(slope)} \bar{u}_{exit}^6 + \Delta D_6^{(slope)} u_{exit}^5 \bar{u}_{exit}^2 \right],$$

with $$\Delta C_3^{(slope)} = \frac{L_m^3 L (k_m \bar{k} + \bar{k}_m k)}{6 f_t}, \quad [6.3a]$$

$$\Delta D_4^{(slope)} = -\frac{L_m^3 L^3 |k|^2 \bar{k}_m}{36 f_t}, \quad [6.3b]$$

$$\Delta A_5^{(slope)} = 2 f_t^3 L^3 L_m k^3 \bar{k}_m + \frac{L^5 L_m^3 k^2 \bar{k} k_m}{40 f_t} \approx 2 f_t^3 L^3 L_m k^3 \bar{k}_m, \text{ and} \quad [6.3c]$$

$$\Delta D_6^{(slope)} = -\frac{1}{3} f_t^3 L^5 L_m k \bar{k}^3 k_m + \frac{11 L^7 L_m^3 k \bar{k}^3 k_m}{1008 f_t} + \frac{47 L^7 L_m^3 |k|^4 k_m}{3024 f_t} \quad [6.3d]$$
$$\approx -\frac{1}{3} f_t^3 L^5 L_m k \bar{k}^3 k_m$$

It is noted that both [6.3c] and [6.3d] are both largely dominated by their respective first terms. The dominating terms in $\Delta A_5^{(slope)}$ and $\Delta D_6^{(slope)}$, both linearly proportional to $\bar{k}_m$ and $k_m$ respectively, show that a properly oriented mid-hexapole field can compensate either A5 or D6, both the real and anisotropic (imaginary) part.

A simple derivation of the dominating terms $\Delta A_5^{(slope)} \approx 2 f_t^3 L^3 L_m k^3 \bar{k}_m$ and $\Delta D_6^{(slope)} \approx -f_t^3 L^5 L_m k \bar{k}^3 k_m / 3$ is as follows:

Redefining the aberrations of one hexapole: both entrance position and slope ($u_{in}$, $u_{in}'$) and exit position and slope ($u_{out}$, $u'_{out}$) are defined asymptotically at the hexapole center. Substituting $u[u_0, u'_0]$ and $u[u_0, u'_0]$ for one hexapole of length L, given in section 2.1, these aberrations can be found via $$\begin{pmatrix} u_{out} \\ u'_{out} \end{pmatrix} = \begin{pmatrix} 1 & -L/2 \\ 0 & 1 \end{pmatrix} \begin{pmatrix} u[u_{in} - u'_{in} L/2, u'_{in}] \\ u'[u_{in} - u'_{in} L/2, u'_{in}] \end{pmatrix}. \quad [6.4]$$

Because $\Delta A_5^{(slope)}$ and $\Delta D_6^{(slope)}$ are triple-combination aberrations, only a few aberration coefficients of the individual hexapoles are needed to calculate them. Using $$\begin{pmatrix} u_{out} \\ u'_{out} \end{pmatrix} = \begin{pmatrix} u_{in} \\ u'_{in} + kL\bar{u}_{in}^2 + |k|^2 L^3 u_{in}^2 \bar{u}_{in}/3 \end{pmatrix} \quad [6.5]$$

for the outer two hexapoles, and $$\begin{pmatrix} u_{out} \\ u'_{out} \end{pmatrix} = \begin{pmatrix} u_{in} \\ u'_{in} + k_m L_m \bar{u}_{in}^2 \end{pmatrix} \quad [6.6]$$

for the weak mid-hexapole, then the dominating terms of $\Delta A_5^{(slope)}$ and $\Delta D_6^{(slope)}$ are already found:

First hexapole: $\begin{pmatrix} u_1 \\ u'_1 \end{pmatrix} = \begin{pmatrix} u_0 \\ kL\bar{u}_0^2 + |k|^2 L^3 u_0^2 \bar{u}_0 /3 \end{pmatrix} \quad [6.7]$ -continued Aberration-free transfer optics including mid-hexapole: [6.8]

$$\begin{pmatrix} u_2 \\ u'_2 \end{pmatrix} = \begin{pmatrix} -u_1 + A_{2m}\bar{u}_1'^2 \\ -u'_1 \end{pmatrix}$$

with $A_{2m} = k_m \cdot L_m \cdot f_t^3$.

Last hexapole: $\begin{pmatrix} u_3 \\ u'_3 \end{pmatrix} = \begin{pmatrix} u_2 \\ u'_2 + kL\bar{u}_2^2 + |k|^2 L^3 u_2^2 \bar{u}_2 /3 \end{pmatrix}. \quad [6.9]$ Up to sixth order in $u_0$ and $\bar{u}_0$, this leads to $$u_3 = -u_0 + A_{2m}\bar{k}^2 L^2 u_0^4 \quad [6.10a]$$

and $$u'_3 = -\frac{2}{3} k \bar{k} L^3 u_0^2 \bar{u}_0 - 2\bar{A}_{2m} k^3 L^3 \bar{u}_0^5 + \quad [6.10b]$$
$$\frac{2}{3} A_{2m} k \bar{k}^3 L^5 u_0^5 \bar{u}_0 - \bar{A}_{2m} k^3 \bar{k} L^5 u_0^2 \bar{u}_0^4$$

Writing $u_3'$ as a function of $u_3$ yields $$u_3' = \frac{2}{3}|k|^2 L^3 u_3^2 \bar{u}_3 + 2\bar{A}_{2m} k^3 L^3 \bar{u}_3^5 - \frac{2}{3} A_{2m} k\bar{k}^3 L^5 u_3^5 \bar{u}_3 - \quad [6.11]$$
$$\frac{5}{3}\bar{A}_{2m} k^3 \bar{k} L^5 u_3^2 \bar{u}_3^4$$
$$= 2\frac{\partial}{\partial \bar{u}_3} \text{Re}\left[\frac{1}{4} C_3^{(slope)} u_3^2 \bar{u}_3^2 + \frac{1}{6}\Delta A_5^{(slope)} \bar{u}_3^6 + \Delta D_6^{(slope)} u_3^5 \bar{u}_3^2\right]$$

with indeed the previously found approximations:

$$\Delta A_5^{(slope)} = 2\bar{A}_{2m} k^3 L^3 = 2f_t^3 L^3 L_m k^3 \bar{k}_m \quad [6.12a]$$

and $$\Delta D_6^{(slope)} = -A_{2m} k\bar{k}^3 L^5/3 = -f_t^3 L^5 L_m k\bar{k}^3 k_m/3 \quad [6.12b]$$

The invention claimed is:

1. A corrector for correcting axial aberrations of a particle-optical lens, the corrector to be irradiated with a beam of charged particles, the corrector comprising:
    a first multipole for generating a first hexapole field;
    a second multipole substantially aligned with the first multipole for generating a second hexapole field substantially aligned with the first hexapole field;
    an optical system for imaging the first multipole on the second multipole and for forming a cross-over of the beam between the multipoles, the optical system having a negative magnification; and
    at least one additional multipole for generating at least one additional hexapole field, wherein the at least one additional multipole is located between the first multipole and the second multipole and is not imaged on the first and the second multipole, wherein the at least one additional hexapole field is suited for correcting the six-fold astigmatism A5 of the corrector or sixth-order three-lobe aberration D6 of the corrector, wherein the at least one additional hexapole field is positioned at or symmetric around the beam cross-over, and wherein the strength of the at least one additional hexapole field is less than the strength of the first and second hexapole fields.

2. The corrector of claim 1 in which the at least one additional multipole is one multipole for generating one additional hexapole field, said additional hexapole field spatially overlapping the cross-over.

3. The corrector of claim 1 in which the at least one additional multipole comprises two multipoles for generating two additional hexapole fields, one of the two additional multipoles located between the cross-over and the first multipole and the other of the two additional multipoles located between the cross-over and the second multipole.

4. The corrector according to claim 1 in which the optical system comprises round lenses.

5. The corrector according to claim 1 in which the multipoles are electrostatic multipoles.

6. The corrector according to claim 1 in which the optical system is an electrostatic optical system.

7. The corrector according to claim 1 in which the corrector further comprises multipoles for generating dipole and/or quadrupole fields and/or hexapole fields located between the first and the second multipole for correcting parasitic aberrations, including mechanical misalignments.

8. The corrector according to claim 1 in which the optical system comprises one thick lens for forming the cross-over and for imaging the first multipole on the second multipole.

9. The corrector according to claim 1 in which the optical system consists of a single lens and in which the third multipole spatially overlaps with the single lens.

10. The corrector of claim 9 in which the single lens is a double-gap lens which reduces anisotropic aberrations.

11. A particle-optical apparatus equipped with the corrector according to claim 1.

12. The particle-optical apparatus according to claim 11 in which transfer optics are placed between the corrector and the particle-optical lens, the transfer optics imaging the first multipole and the second multipole on the particle-optical lens, or the particle-optical lens imaging the first multipole and the second multipole on the transfer optics.

13. A method of using the particle optical apparatus according to claim 11 in which the additional multipole is excited such that the corrector shows less A5 and/or D6 than without exciting the additional multipole.

14. The method according to claim 13 in which the additional multipole is excited such that A5 and/or D6 of the corrector are reduced by at least 80%.

15. The method according to claim 13 in which the additional multipole is excited such, that aberrations other than A5 and/or D6 are dominant over A5 and/or D6.

16. The method according to claim 13 in which the additional multipole is excited such that A5 and/or D6 of the corrector are reduced by at least 95%.

* * * * *